United States Patent [19]

Kourimsky et al.

[11] 4,255,004

[45] Mar. 10, 1981

[54] ELECTRICAL JUNCTION BOX

[75] Inventors: Friedrich J. A. Kourimsky, Bensheim; Lothar H. W. Nix, Walldorf, both of Fed. Rep. of Germany

[73] Assignee: AMP Incorporated, Harrisburg, Pa.

[21] Appl. No.: 41,460

[22] Filed: May 22, 1979

[30] Foreign Application Priority Data

May 30, 1978 [GB] United Kingdom ............... 24081/78

[51] Int. Cl.³ ..................... H01R 9/00; H01R 23/72
[52] U.S. Cl. ............................... 339/17 E; 339/18 R; 361/412
[58] Field of Search ............... 339/17 E, 17 M, 17 N, 339/122 R, 18 R, 18 B, 18 C, 198 R; 361/399, 406, 409, 410, 412–416

[56] References Cited

U.S. PATENT DOCUMENTS

| 2,221,710 | 11/1940 | Johnson | 339/198 H |
| 3,272,909 | 9/1966 | Bruck et al. | 339/17 E |
| 3,302,068 | 1/1967 | Warman et al. | 361/416 |
| 3,590,330 | 6/1971 | Teagno | 361/413 |
| 4,135,226 | 1/1979 | Kourimsky | 361/415 |

Primary Examiner—Neil Abrams
Attorney, Agent, or Firm—A. B. Osborne; F. W. Raring

[57] ABSTRACT

A junction box comprising a stack of terminal boards sandwiched between opposite faces of a rigid insulating housing, each terminal board comprising a series of metal strips spaced apart on an insulating sheet to define discrete current paths, substantially rigid end portions of at least some of the strips extending from each layer perpendicularly of the planes of the layers and being located in channels formed in insulating ribs in the housing to provide contact portions for connection of external circuitry to current paths in respective layers.

3 Claims, 7 Drawing Figures

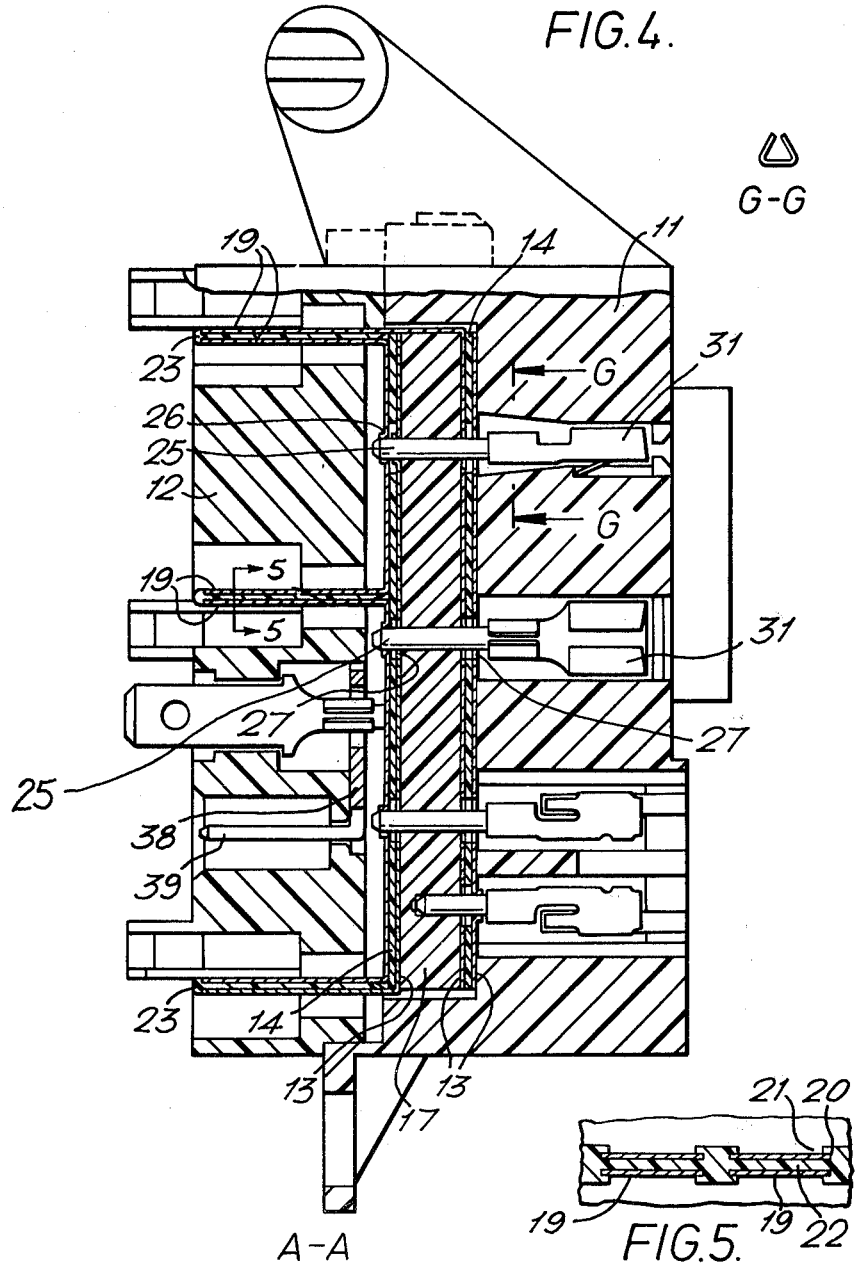

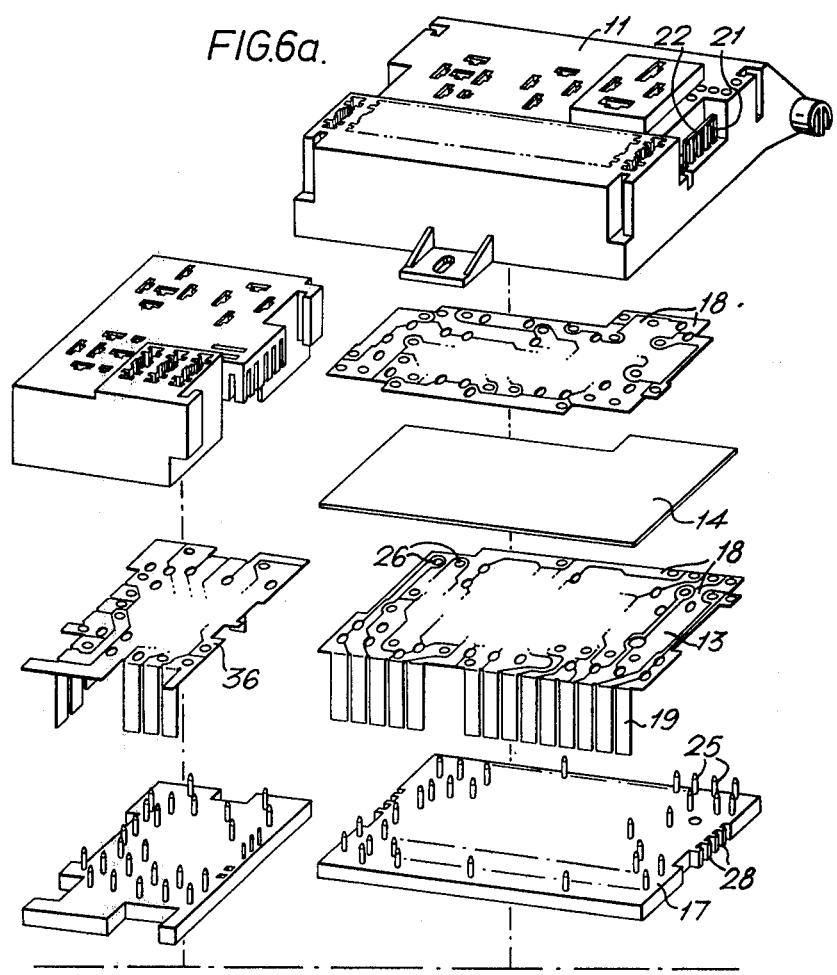

ELECTRICAL JUNCTION BOX

The invention relates to junction boxes particularly for automobiles.

It is important that such junction boxes be compact in the interests of space saving and yet that manufacturing costs be acceptable.

A junction box according to the invention comprises a series of metal strips mounted mutually spaced apart in a common plane on an insulating carrier to define a terminal board with discrete current paths, substantially rigid end portions of at least some of the strips extending out of the plane of the board and being located in channels in insulating supports to provide contact portions for connection of the respective strips to external circuitry.

Preferably, the contact portions define tab assemblies for receipt in female contacts of external circuitry. The channels may each be undercut at the bases, opposite edge portions of the strip end portions being received in the undercuts preventing lateral movement of the strip out of the channel. The insulating support may be provided by a junction box housing.

The junction box may include a stack of terminal boards sandwiched between opposite faces of a rigid insulating housing, end portions of at least some of the strips extending from each layer perpendicularly of the planes of the layers to provide the contact portions for connection to respective strips in various layers.

Preferably, end portions of different strips are located in aligned channels formed on opposite sides of an insulating rib provided in the junction box housing.

This enables connection to separate strips, possibly in different layers, to be made by a single female contact receiving both end portions. End portions may extend out of the planes of the board or boards in opposite directions.

The provision of the contact portions instead of separate terminals enables a high concentration of connections to be established to the terminal boards resulting in space saving and acceptable manufacturing cost.

The invention is particularly suitable for use in the junction box assembly described in German patent application No. 2821992 (4732) in which a main junction box has provision for connection to auxiliary junction boxes. The end portions may be located in channels of ribs provided on the main box and the female contact may be located in the auxiliary box enabling connection between current paths in the respective boxes to be established by locating the circuit boards in parallel planes and by movement of the boxes relatively towards each other in directions perpendicular to the planes of the circuit boards. This enables auxiliary boxes to be connected to the main box already mounted against the bulkhead of an automobile engine compartment.

An example of a junction box assembly according to the invention will now be described with reference to the accompanying drawings, in which:

FIGS. 2, 3 and 4 are cross-sectional views taken along the lines indicated in the drawings;

FIG. 5 is a transverse cross-sectional view of a tab assembly; and

FIGS. 6a and 6b are an exploded view of the main junction box assembly and one auxiliary junction box, these views being such that FIG. 6a can be placed above FIG. 6b, with the broken lines coinciding, to provide a complete view of the exploded junction box and the auxiliary junction box.

Figure 1:
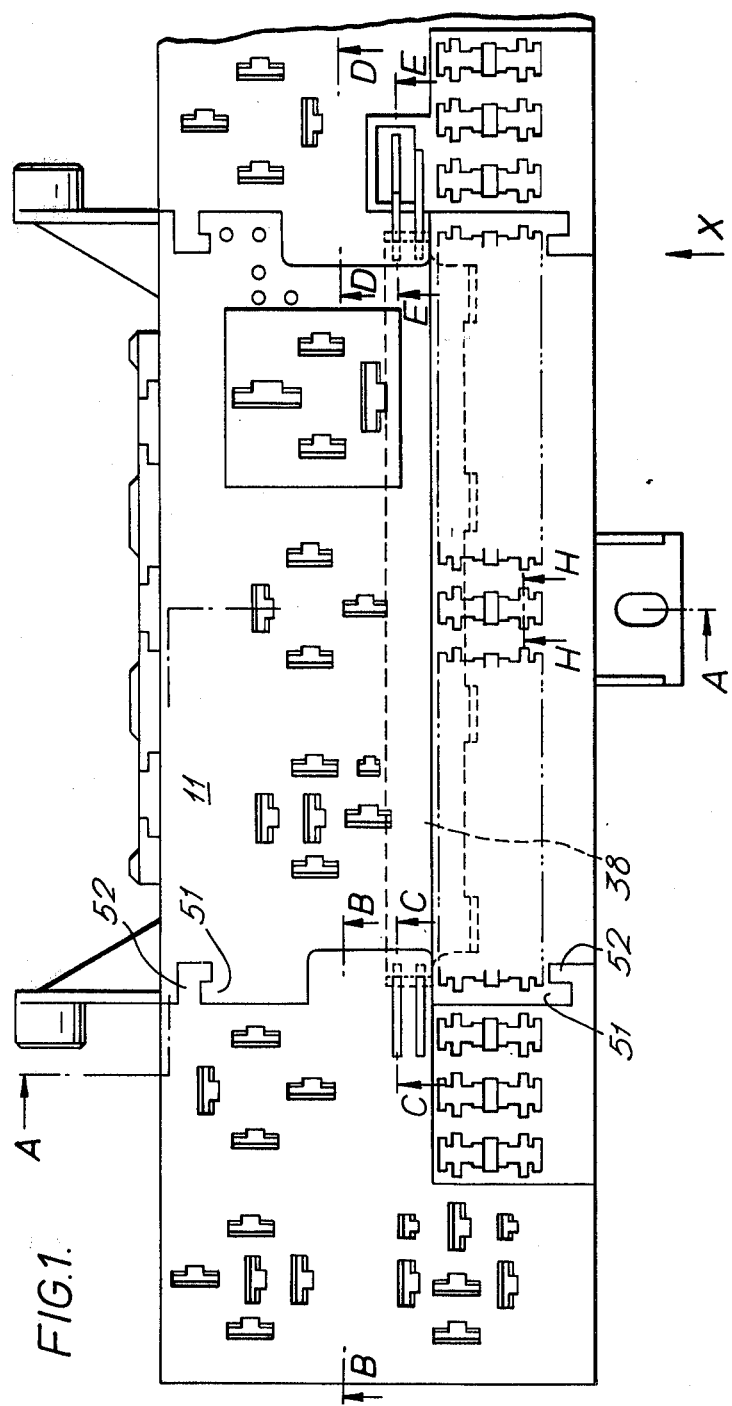
FIG. 1 is a plan view of the junction box assembly.
Figure 2:
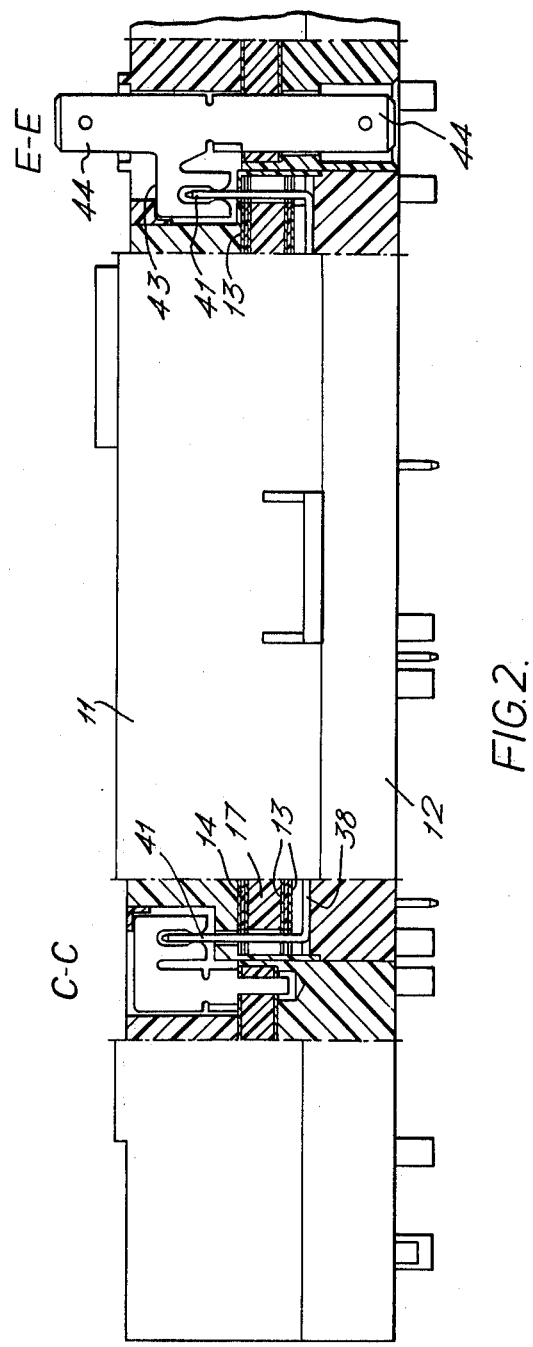
Figure 3:
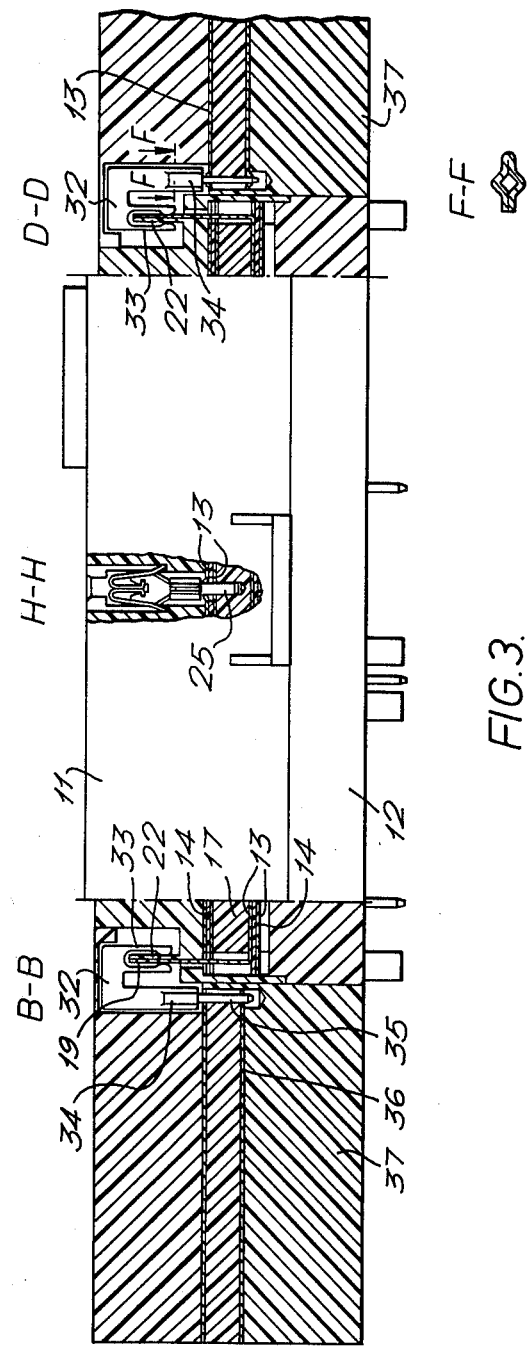
Figure 6B:
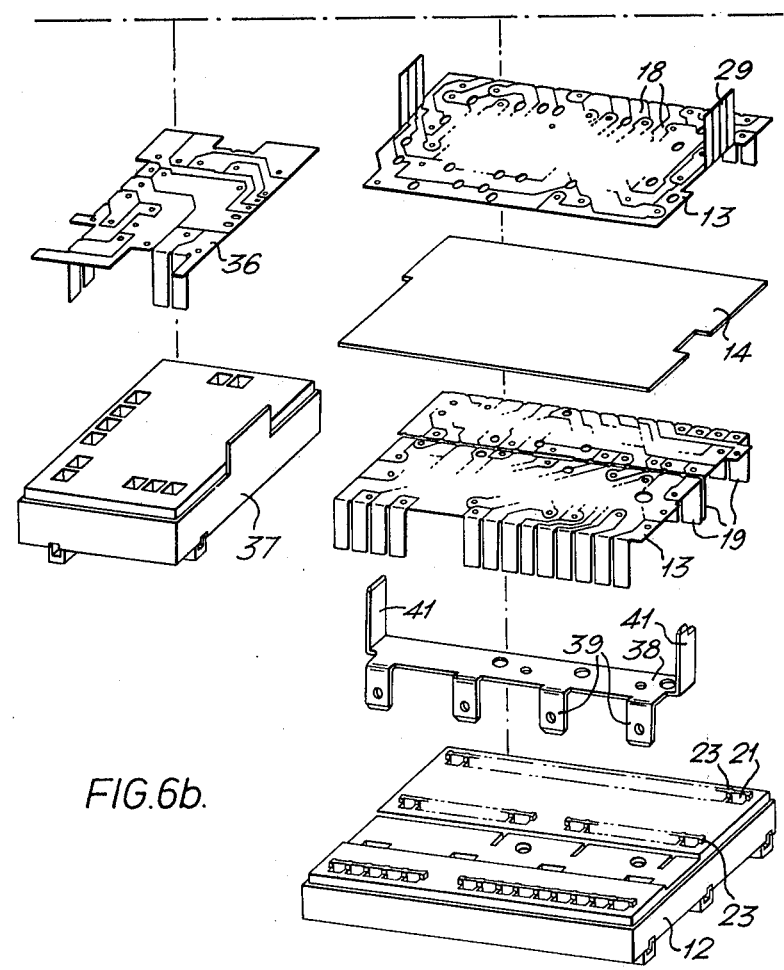

The main junction box comprises a cover 11 and base 12 each moulded in one piece from plastics material between opposite inner faces of which are located circuit boards 13. Each circuit board comprises a sheet of copper bonded to a flexible insulating carrier sheet (e.g. double-sided adhesive tape, not shown), two or more of such boards being bonded to a rigid carrier 14 and the assembly applied to respective opposite faces of a rigid carrier base 17. Each sheet is divided (e.g. by etching) into discrete strips forming circuit paths 18, end portions 19 of some of which strips are bent perpendicularly to the plane of the circuit board in either direction and are received in undercut portions 20 of channels 21 formed in ribs 22, 23 formed in the cover 11 and base 12 to provide tab assemblies for receipt in socket connectors of external circuitry.

The carrier base 17 may be moulded of plastics material with contact pins 25 in situ projecting from opposite faces, or the contact pins may be force fitted into apertures in the carrier. The pins form an interference fit in sockets 26 in selected strips of the circuit boards which sockets 26 are formed by pushing out frusto-conical portions of the strips, which portions may be provided with serrated edges to improve resiliency. Apertures 27 are provided in the layers of strip where connection with a contact pin is not required. One pair of opposite edges of the barrier 17 is castellated to provide insulating projections 28 separating the individual strips of two sets of strip end portions 29.

External connections to the strips centrally of the circuit boards are made through socket connectors 31 located in apertures in the cover and base and received on selected pins and at one pair of opposite edges by fork contacts 32 receiving the tab assemblies. The fork contacts 32 are mounted in cavities in auxiliary junction boxes 37 and are each stamped and formed from a single metal piece and have a U-profile one arm of which is formed as a fork 33 and the other arm as a socket 34 for receipt on a pin 35 mounted in a circuit board 36 of the auxiliary junction box 37.

High current distribution may be afforded by a bus bar 38 having laterally extending tabs 39 passing through apertures 40 in the base 12 and tabs 41 bent up from opposite ends and received in fork contacts 43 having tabs 44 connected to circuit boards 36 of the auxiliary junction boxes 37 and extending to opposite sides of the auxiliary box.

The junction box is adapted for manufacture and assembly by mass production techniques. The strip providing the circuit paths are firstly formed from copper sheets by an etching or stamping process, the end portions are bent out of the plane of the sheets and the copper sheets are then bonded to respective opposite sides of the insulating tape. Metal bridges connecting adjacent strips are then stamped away and the circuit boards so formed are bonded to opposite faces of the rigid carrier and then pressed onto the pins 25. The cover and base are then applied together with the respective strip end portions being received with longitudinal sliding movement in the channels and the bus bar located in the base. The cover and base may be bonded and/or welded together.

The auxiliary boxes may be assembled in similar fashion with the omission of insulating carrier 14 and attached to the main box by engagement between the respective fork contacts and tab assemblies and interlocking tongues 51, 52 respectively provided on the housing of the main and auxiliary boxes.

Reference is made to the above mentioned specification for details relating to the functions of the respective junction boxes.

In an alternative example, for manufacturing convenience, the insulating carrier base 17 is initially formed as two separate sheets of material sufficiently thin to permit the mechanical insertion of pins in one sheet to protrude from one face. The other sheet is subsequently bonded to the other face. The ribs may be moulded as units which can be inserted into the cover and base to avoid moulding difficulties and to facilitate assembly of the junction box as the end portions of the strips may then be inserted into the respective channels prior to assembly of the rib units with the cover or base. The insertion of the end portions in the channels is much more easily achieved when the ribs are formed as separate units which can readily be manipulated.

What is claimed is:

1. An electrical junction box comprising:
   a two-part insulating housing having opposed spaced-apart internal faces,
   an insulating carrier base between said opposed faces,
   a pair of terminal boards on said carrier base, each of said terminal boards being proximate to one of said faces, each said terminal board having conductive metal strips thereon,
   contact pins mounted in said carrier base, said terminal pins being selectively connected to said conductive metal strips and having means thereon proximate to, and accessible from, one surface of said housing for making connections to external circuitry,
   at least some of said conductive strips having end portions which extend perpendicularly of the planes of said circuit boards and towards surface portions of said housing, said end portions being located in channels, said channels being integral with said housing, said channels and said end portions being dimensioned to receive a multi-contact connector.

2. A junction box as set forth in claim 1, and at least one auxiliary junction box coupled to said junction box at one end thereof, said auxiliary junction box having disengageable contact means therein in engagement with at least one of said end portions whereby circuitry in said auxiliary junction box is connected to circuitry in said junction box.

3. A junction box as set forth in claim 2, said disengageable contact means comprising fork contact means.

* * * * *